(12) United States Patent
Yan et al.

(10) Patent No.: US 9,269,583 B1
(45) Date of Patent: Feb. 23, 2016

(54) METHOD FOR FABRICATING MEMORY DEVICE

(71) Applicant: MACRONIX International Co., Ltd., Hsinchu (TW)

(72) Inventors: Shih-Guei Yan, Hsinchu (TW); Chih-Chieh Cheng, Hsinchu (TW); Wen-Jer Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/530,082

(22) Filed: Oct. 31, 2014

(51) Int. Cl.
*H01L 21/8244* (2006.01)
*H01L 21/266* (2006.01)
*H01L 27/115* (2006.01)
*H01L 21/225* (2006.01)
*H01L 29/66* (2006.01)

(52) U.S. Cl.
CPC .......... *H01L 21/266* (2013.01); *H01L 21/2253* (2013.01); *H01L 27/11568* (2013.01); *H01L 27/11578* (2013.01); *H01L 29/66803* (2013.01)

(58) Field of Classification Search
CPC .................. H01L 27/10826; H01L 27/10879; H01L 27/1211; H01L 29/41791; H01L 2924/13067

USPC .......................................... 438/149–160, 253
See application file for complete search history.

(56) References Cited

U.S. PATENT DOCUMENTS

| 8,691,640 B1 * | 4/2014 | LiCausi | ............ H01L 29/66795 257/E21.421 |
| 2014/0044829 A1 * | 2/2014 | Gilkey | .................. A23L 1/3002 426/2 |

* cited by examiner

*Primary Examiner* — Brook Kebede
(74) *Attorney, Agent, or Firm* — J.C. Patents

(57) ABSTRACT

Provided is a method for fabricating a memory device, including the following steps. A plurality of semiconductor fin structures is formed on a substrate. Each semiconductor fin structure includes a first doped region and a body region on which the first doped region is disposed, and a trench is disposed between adjacent two semiconductor fin structures. A second doped region is formed in the substrate under the body regions of the semiconductor fin structures and the trenches. A plurality of first contacts are formed on the substrate. A plurality of second contacts are formed on the substrate. Each second contact is electrically connected with the corresponding first doped region.

17 Claims, 7 Drawing Sheets

METHOD FOR FABRICATING MEMORY DEVICE

BACKGROUND OF THE INVENTION

1. Field of the Invention

The invention relates to a fabricating method of a semiconductor device and more particularly relates to a fabricating method of a memory device.

2. Description of Related Art

A non-volatile memory can repeatedly perform operations of data writing, reading, and erasing, and is advantageous in that the data stored therein does not disappear even if the power supply is shut down. For this reason, the non-volatile memory has been used as the memory device for various electronic products.

However, due to the decreasing sizes of semiconductor devices, the short channel effect of the traditional horizontal memory device becomes worse. This effect will lead to the deterioration of the second bit effect and program disturbance in the memory device. In order to improve this problem, vertical memory devices have been developed and introduced in the recent years, wherein the channel length remains unchanged while the size is reduced, so as to prevent the short channel effect.

In the vertical memory device, as the elements are stacked on each other to form the structure, the fabrication is more complicated compared with the horizontal memory device. Therefore, how to simplify the fabricating processes of the vertical memory device remains an issue that needs to be overcome.

SUMMARY OF THE INVENTION

The invention provides a fabricating method of a memory device, which simplifies fabricating processes of a vertical memory device and is compatible with the existing processes.

The invention provides a fabricating method of a memory device, and the fabricating method includes the following. A substrate, including a first portion and a second portion, is provided. A plurality of semiconductor fin structures are formed on the substrate of the first portion. Each of the semiconductor fin structures extends in a first direction and includes a first doped region and a body region. The first doped region is disposed on the body region. A trench is formed between two adjacent semiconductor fin structures. A second doped region is formed in the substrate under the body regions of the semiconductor fin structures and the trench, and extends into the substrate of the second portion.

In an embodiment of the invention, a method of forming the semiconductor fin structures includes the following. A doped layer is formed on the substrate. The doped layer and the substrate are patterned to form the semiconductor fin structures.

In an embodiment of the invention, the fabricating method further includes the following. A hard mask layer is formed on the doped layer before the doped layer and the substrate are patterned. A patterned mask layer is forming on the hard mask layer. The hard mask layer, the doped layer, and the substrate are patterned with the patterned mask layer as a mask to form a plurality of patterned hard mask layers, the first doped regions, and the body regions.

In an embodiment of the invention, the hard mask layer includes an oxide layer and a nitride layer.

In an embodiment of the invention, a material of the hard mask layer includes silicon oxide, silicon nitride, an advanced patterning film, or a combination thereof.

In an embodiment of the invention, a method of forming the second doped region includes performing an ion implantation process on the substrate with the patterned hard mask layers as masks to implant a dopant in the substrate and form the second doped region.

In an embodiment of the invention, the fabricating method further includes performing a thermal annealing process to cause the dopant to form the second doped region.

In an embodiment of the invention, the fabricating method further includes removing the patterned hard mask layers.

In an embodiment of the invention, the method of forming the semiconductor fin structures includes the following. A stack layer is formed on the substrate, wherein the stack layer includes a first doped layer, a body layer, and a second doped layer in sequence from bottom to top. The first doped layer and the body layer are patterned to form the semiconductor fin structures, wherein the second doped layer serves as the second doped region.

In an embodiment of the invention, the stack layer includes the first doped layer, a first barrier layer, the body layer, a second barrier layer, and the second doped layer in sequence from bottom to top.

In an embodiment of the invention, a material of the barrier layer includes oxide, nitride, oxynitride, or a combination thereof.

In an embodiment of the invention, two bottom corners of each trench are right angles, chamfer angles, or round angles.

In an embodiment of the invention, the fabricating method further includes a plurality of word lines are formed on the substrate. Each of the word lines extends in a second direction and covers a portion of a sidewall and a portion of a top of each of the semiconductor fin structures. The second direction is different from the first direction. A charge storage layer is formed between the semiconductor fin structures and the word lines. A plurality of first contacts are formed on the second portion of the substrate and arranged in the first direction. Each of the first contacts is electrically connected with the second doped region. A plurality of second contacts are formed on the first portion of the substrate. Each of the second contacts is electrically connected with the corresponding first doped region.

In an embodiment of the invention, the fabricating method further includes the following. A plurality of isolation structures are formed in the second portion of the substrate. A third doped region is formed in the substrate between the isolation structures. The third doped region is electrically connected with the second doped region. Each of the first contacts is electrically connected with the second doped region through the third doped region.

In an embodiment of the invention, the fabricating method further includes forming a plurality of contact holes in the substrate of the second portion. A bottom of each of the contact holes exposes the second doped region, and each of the first contacts is electrically connected with the second doped region at the bottom of each of the contact holes.

In an embodiment of the invention, a material of the charge storage layer includes silicon oxide, silicon nitride, or a combination thereof.

In an embodiment of the invention, the second doped region connects each of the semiconductor fin structures.

In an embodiment of the invention, the first doped region, the second doped region, and the third doped region are a first conductivity type. The body region is a second conductivity type. The first conductivity type and the second conductivity type are different.

Based on the above, the fabricating method of the memory device of the invention is to form the second doped region in the substrate under the body region of the semiconductor fin structure and the trench, so as to connect the second doped region with each semiconductor fin structure. In addition, the second doped region extends into the substrate of the second portion, so as to electrically connect the first contacts with the second doped region. Accordingly, the first contacts are electrically connected with each of the semiconductor fin structures. The fabricating method facilitates the connection between internal elements of the vertical memory device and not only significantly simplifies the fabricating processes of the vertical memory device but also simplifies the relative relationship between memory devices and the configuration of the stack structure thereof without sacrificing the operational performance and compatibility with the existing processes.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
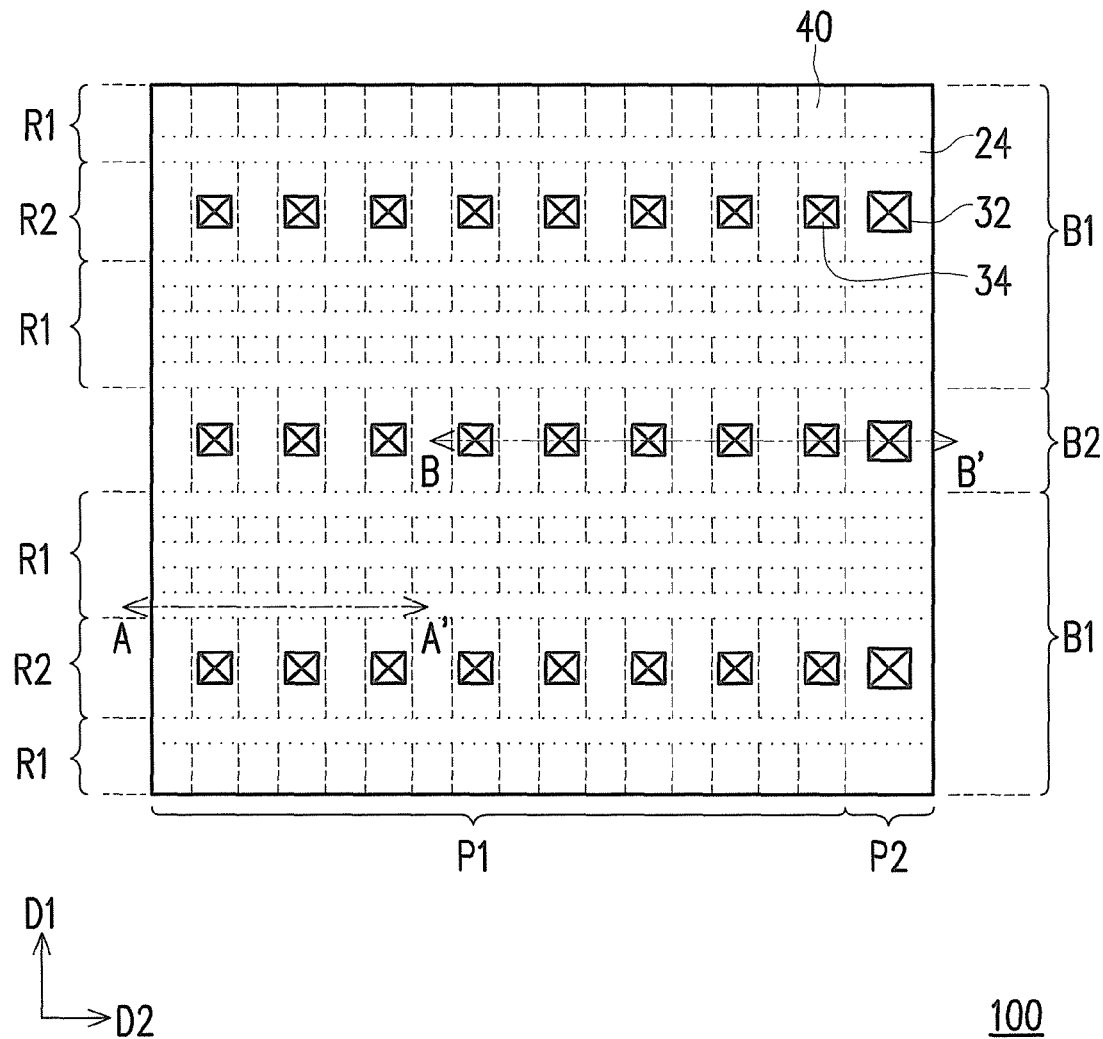
FIG. 1 is a schematic top view illustrating a memory device according to an embodiment of the invention.

FIG. 1 is a schematic top view illustrating a memory device according to an embodiment of the invention. FIG. 2A to FIG. 2G are schematic cross-sectional views, taken along the line A-A' of FIG. 1, illustrating a fabricating method of the memory device.

Figure 2A:
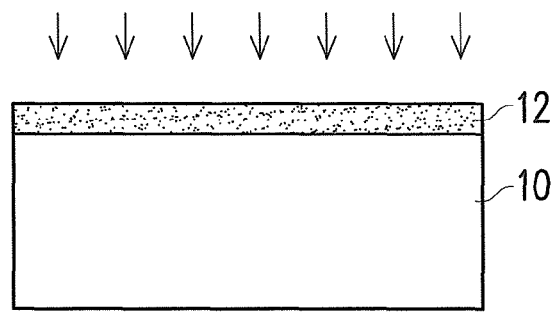
FIG. 2A to FIG. 2G are schematic cross-sectional views, taken along the line A-A' of FIG. 1, illustrating a fabricating method of the memory device.

With reference to FIG. 1 and FIG. 2A, a substrate 10 is provided. When viewed from a first direction D1, the substrate 10 includes a first portion P1 and a second portion P2. The first portion P1 is an array region of a memory device 100, and the second portion P2 is a peripheral region of an array, for example. When viewed from a second direction D2, the substrate 10 includes a plurality of first blocks B1 and a plurality of second blocks B2. The first blocks B1 and the second blocks B2 are disposed alternately. Each of the first blocks B1 includes two first regions R1 and a second region R2. The second region R2 is located between the first regions R1.

The substrate 10 is a semiconductor substrate, a semiconductor compound substrate, or a silicon on insulator (SOI) substrate, for example. The substrate 10 may be doped or not doped. The substrate 10 may include an ion implanted region, which is a P type or N type ion implanted region, for example. The substrate 10 may include a single-layer structure or a multi-layer structure. The substrate 10 may further include a shallow trench isolation (STI) structure. In an embodiment, the substrate 10 is a P type silicon substrate or a P type polysilicon, for example.

Next, a doped layer 12 is formed on the substrate 10. The doped layer 12 may be a first conductivity type, which is N type, for example. A method of forming the doped layer 12 includes performing an ion implantation process on the substrate 10 to implant a dopant into a surface of the substrate 10, for example. The dopant of the doped layer 12 is phosphorus or arsenic, and a dopant dose thereof is in a range of $1 \times 10^{13}/\text{cm}^2$ to $1 \times 10^{14}/\text{cm}^2$, for example.

Figure 2B:
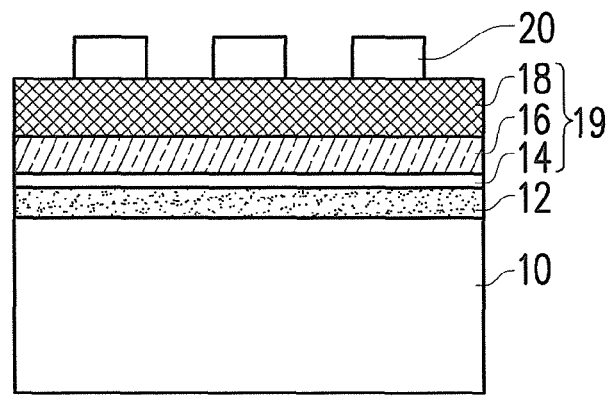

With reference to FIG. 2B, a hard mask layer 19 is formed on the doped layer 12. The hard mask layer 19 may include a single layer or multiple layers. A material of the hard mask layer 19 includes silicon oxide, silicon nitride, an advanced patterning film (APF), or a combination thereof. In an embodiment, the hard mask layer 19 may include an oxide layer 14, a nitride layer 16, and an advanced patterning film layer 18. A method of forming the hard mask layer 19 includes forming the oxide layer 14, the nitride layer 16, and the advanced patterning film layer 18 in sequence on the doped layer 12 by chemical vapor deposition, for example. A thickness of the oxide layer 14 is in a range of 50 angstroms to 100 angstroms, for example. A thickness of the nitride layer 16 is in a range of 500 angstroms to 2000 angstroms, for example. A thickness of the advanced patterning film layer 18 is in a range of 1000 angstroms to 3000 angstroms, for example. In another embodiment, the hard mask layer 19 may include any two of the aforementioned three layers. Then, a patterned mask layer 20 is formed on the hard mask layer 19. A material of the mask layer 20 is a photoresist, for example.

Figure 2C:
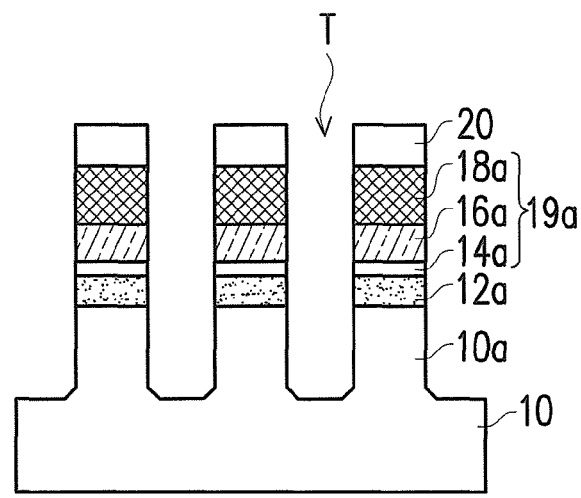

With reference to FIG. 2C, an etching process is performed on the hard mask layer 19, the doped layer 12, and the substrate 10 with the patterned mask layer 20 as a mask, so as to form a plurality of patterned hard mask layers 19a, a plurality of doped regions 12a, a plurality of body regions 10a, and a plurality of trenches T1. The etching process is anisotropic etching, such as dry etching, for example. The dry etching may be plasma etching, reactive ion etching, etc. In an embodiment, the patterned hard mask layer 19a includes a patterned oxide layer 14a, a patterned nitride layer 16a, and a patterned advanced patterning film layer 18a. The body region 10a may be doped or not doped. In an embodiment, the body region 10a is a second conductivity type, which is P type, for example. A doping concentration of the body region 10a is smaller than a doping concentration of the doped region 12a, for example. A thickness of the body region 10a is greater than a thickness of the doped region 12a, for example. The thickness of the body region 10a is in a range of 30 nanometers to 500 nanometers, for example. The thickness of the doped region 12a is in a range of 20 nanometers to 200 nanometers, for example.

A depth of the trench T1 is in a range of 1500 angstroms to 6000 angstroms, for example. In an embodiment, a sidewall of the trench T1 is perpendicular to a bottom surface thereof, for example, so as to prevent implanting the dopant into the body region 10a when performing a subsequent ion implantation process on the substrate 10 under the trench T1. Moreover, two bottom corners of the trench T1 are right angles, chamfer angles, or round angles, for example. In an embodiment, the two bottom corners of the trench T1 are chamfer angles or round angles, for example, so as to facilitate diffusion of the dopant under the trench T1 when performing the subsequent ion implantation process.

Figure 2D:
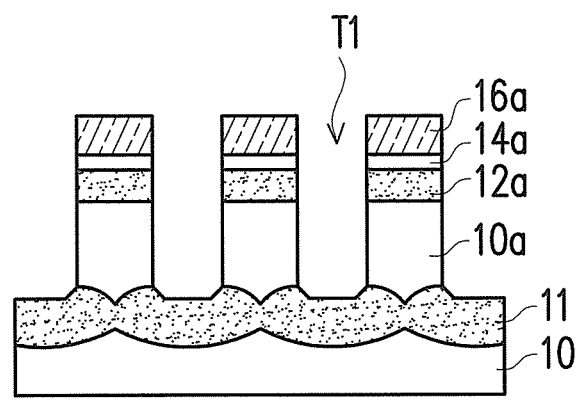

Thereafter, with reference to FIG. 2C and FIG. 2D, the patterned mask layer 20 and the patterned advanced patterning film layer 18a are removed. A method of removing the patterned mask layer 20 and the patterned advanced patterning film layer 18a includes performing a dry or wet stripping/etching process, for example.

Then, an ion implantation process is performed on the substrate 10 with the patterned nitride layer 16a as a mask, so as to implant a dopant into the substrate 10 under the trench T1 to form a doped region 11. The doped region 11 may be the first conductivity type, which is N type, for example. The dopant of the doped region 11 is phosphorus or arsenic, and a dopant dose thereof is in a range of $1\times10^{13}/cm^2$ to $1\times10^{14}/cm^2$, for example. The doping concentrations of the doped region 11 and the doped region 12a may be the same or different. In an embodiment, because the patterned nitride layer 16a located above the doped region 12a blocks the dopant simultaneously implanted into the doped region 12a when the implantation process is performed to form the doped region 11, the doping concentrations of the doped region 11 and the doped region 12a are individually adjustable.

It should be noted that, in an embodiment, because the bottom corners of the trench T1 are chamfer angles or round angles, a diffusion range of the dopant implanted in the doped region 11 is wider, and the dopant further diffuses into the substrate 10 under the body region 10a, so as to form the doped region 11 in the substrate 10 under the body region 10a and the trench T1. In another embodiment, a thermal annealing process is performed on the substrate 10 after performing the ion implantation process, so as to diffuse the implanted dopant into the substrate 10 under the body region 10a. In yet another embodiment, the doped region 11 further extends into the substrate 10 of the second portion P2.

Figure 2E:
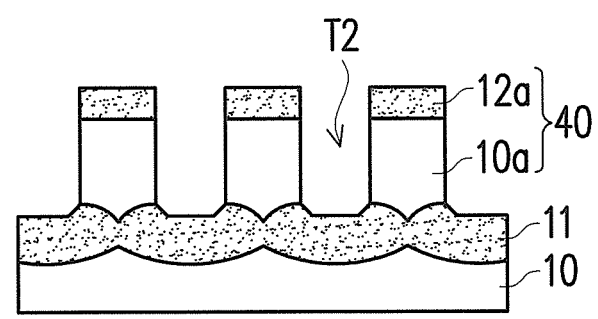

With reference to FIG. 1 and FIG. 2E, the patterned nitride layer 16a and the patterned oxide layer 14a are removed to form a plurality of semiconductor fin structures 40 on the substrate 10 of the first portion P1. Each of the semiconductor fin structures 40 extends in the first direction D1 and includes the doped region 12a and the body region 10a. The doped region 12a is disposed on the body region 10a. A trench T2 is disposed between two adjacent semiconductor fin structures 40. The doped region 11/the body region 10a/the doped region 12a serve as a source/a body/a drain, for example. It should be noted that, because the doped region 11 is disposed in the substrate 10 under the body region 10a of the semiconductor fin structure 40 and the trench T2, the doped region 11 connects the semiconductor fin structures 40. When the doped region 11 is used as the source, the source of each of the semiconductor fin structures 40 is electrically connected with each other. In an embodiment of the invention, the process of removing the patterned nitride layer 16a and the patterned oxide layer 14a may be omitted.

Figure 5A:
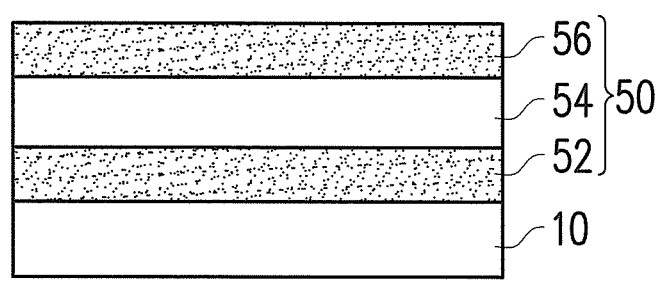
FIG. 5A to FIG. 5B are schematic cross-sectional views illustrating a fabricating method of partial components of a memory device according to another embodiment of the invention.
Figure 5B:
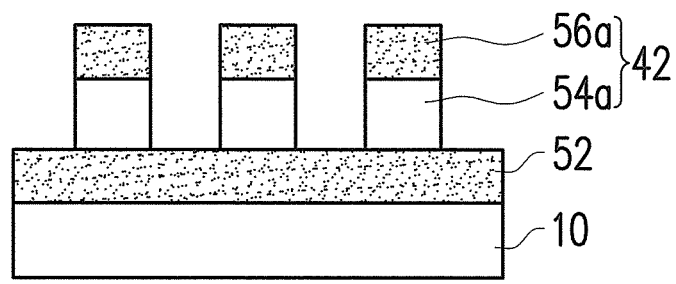
Figure 6A:
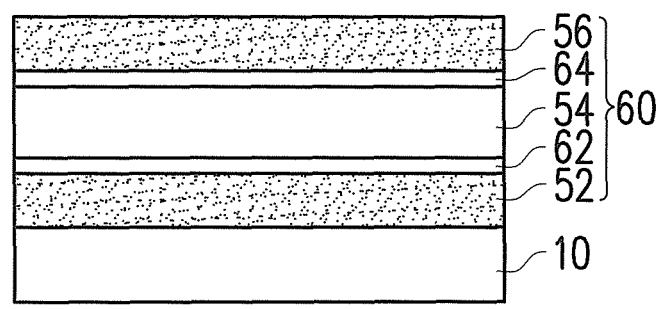
FIG. 6A to FIG. 6B are schematic cross-sectional views illustrating a fabricating method of partial components of a memory device according to yet another embodiment of the invention.
Figure 6B:
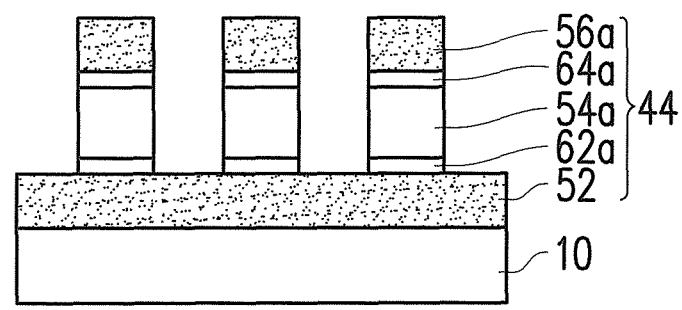

FIG. 5A to FIG. 5B are schematic cross-sectional views illustrating a fabricating method of partial components of a memory device according to another embodiment of the invention. FIG. 6A to FIG. 6B are schematic cross-sectional views illustrating a fabricating method of partial components of a memory device according to yet another embodiment of the invention.

In another embodiment of the invention, the semiconductor fin structures 40 are semiconductor fin structures 42 as shown in FIG. 5B. With reference to FIG. 5A, a method of forming the semiconductor fin structures 40 includes forming a stack layer 50 on the substrate 10, for example. The stack layer 50 includes a doped layer 52, a body layer 54, and a doped layer 56 in sequence from bottom to top. The doped layer 52, the body layer 54, and the doped layer 56 may be formed respectively by chemical vapor deposition. Next, with reference to FIG. 5B, a photolithographic and etching process is performed to pattern the body layer 54 and the doped layer 56, so as to form the semiconductor fin structures 42. Each of the semiconductor fin structures 42 includes a body region 54a and a doped region 56a. The doped layer 52 is also called the doped region. The doped layer (doped region) 52/the body region 54a/the doped region 56a serve as a source/a body/a drain, for example. It should be noted that, because the doped layer 52 under the body region 54a is not etched, when serving as the source, the source of each of the semiconductor fin structures 42 is electrically connected with each other.

In yet another embodiment of the invention, the semiconductor fin structures 40 are semiconductor fin structures 44 as shown in FIG. 6B. With reference to FIG. 6A, a method of forming the semiconductor fin structures 44 includes foaming a stack layer 60 on the substrate 10 first, for example. The stack layer 60 includes a doped layer 52, a barrier layer 62, a body layer 54, a barrier layer 64, and a doped layer 56 in sequence from bottom to top. The thicknesses of the barrier layer 62 and the barrier layer 64 are sufficient to block diffusion of the dopant of the doped layer 52, the body layer 54, and the doped layer 56 and allow a charge carrier (e.g. electron or hole) to easily tunnel. In an embodiment, a material of the barrier layer 62 and the barrier layer 64 includes oxide, nitride, oxynitride, or a combination thereof. A method of forming the barrier layer 62 and the barrier layer 64 includes chemical vapor deposition, for example. Thereafter, with reference to FIG. 6B, the barrier layer 62, the body layer 54, the barrier layer 64, and the doped layer 56 are patterned to form the semiconductor fin structures 44. Compared with the semiconductor fin structures 42, the semiconductor fin structures 44 further include a patterned barrier layer 62a and a patterned barrier layer 64a.

Figure 2F:
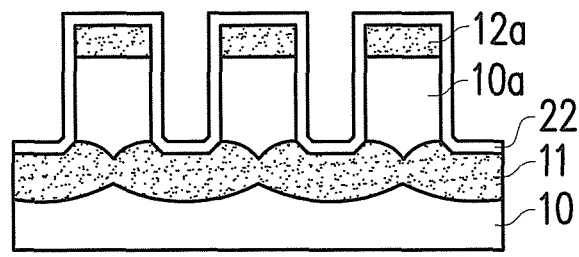
Figure 2G:
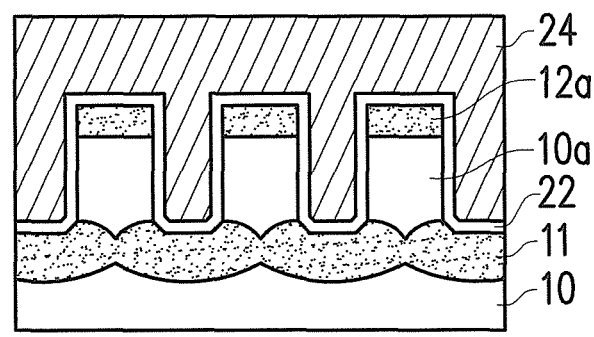

With reference to FIG. 2F, after forming the semiconductor fin structures 40 (or the semiconductor fin structures 42 or 44), a charge storage layer 22 is formed on the substrate 10. The charge storage layer 22 is conformally formed on a top surface and a lateral surface of the semiconductor fin structure 40. Because the charge storage layer 22 is disposed on the top surface and the lateral surface of the semiconductor fin structure 40, in addition to a charge storage function, the charge storage layer 22 also provides an effect of electrically insulating the doped region 11 and the doped region 12a from a word line 24 (as shown in FIG. 2G) that is formed in a subsequent process. In an embodiment, the charge storage layer 22 is, for example, a composite layer composed of Oxide-Nitride-Oxide (ONO). The composite layer may include three layers or more. A material of the charge storage layer 22 includes silicon oxide, silicon nitride, or a combination thereof, for example. A method of forming the charge storage layer 22 includes chemical vapor deposition or thermal oxidation, for example.

With reference to FIG. 1 and FIG. 2G, the word line 24 is formed on charge storage layer 22. A material of the word line 24 includes N+ doped polysilicon, P+ doped polysilicon, a metal material, or a combination thereof, for example. Each word line 24 extends in the second direction D2 and covers a portion of a sidewall and a portion of a top of each of the semiconductor fin structures 40. That is to say, the charge storage layer 22 is disposed between the semiconductor fin structure 40 and the word line 24. The word line 24 serves as a control gate, for example. The first direction D1 is different from the second direction D2. In an exemplary embodiment, the first direction D1 is substantially perpendicular to the second direction D2.

Figure 3:
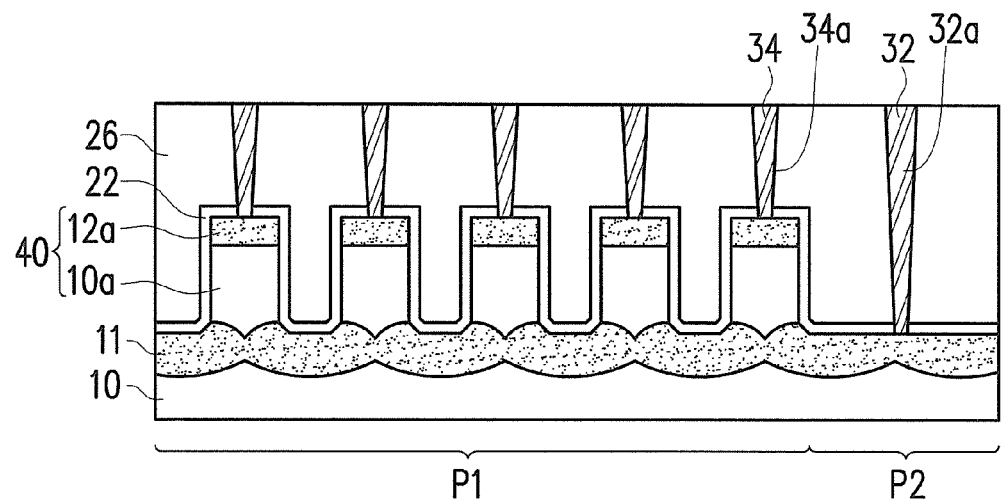
FIG. 3 is a schematic cross-sectional view taken along the line B-B' of FIG. 1 according to an embodiment of the invention.
Figure 4:
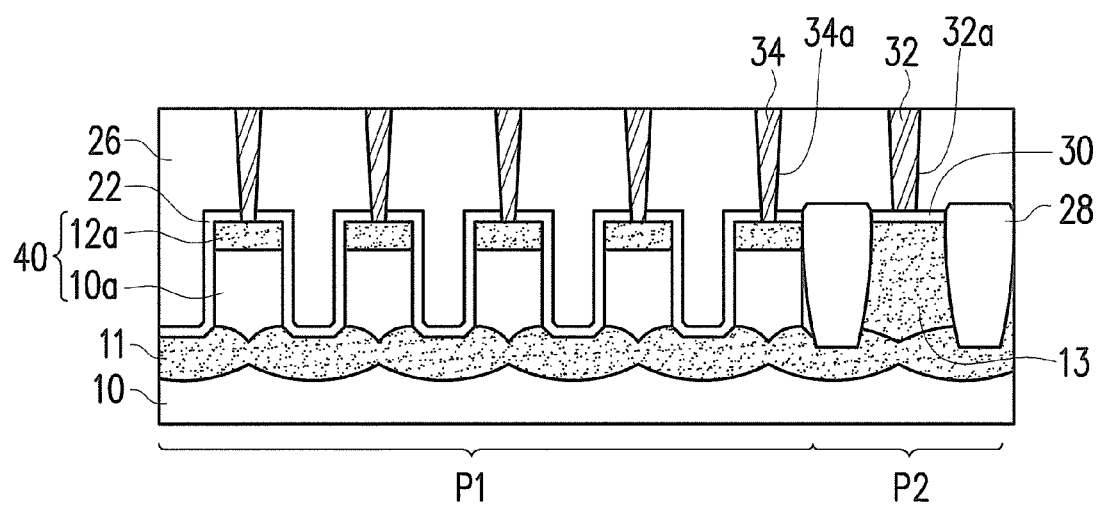
FIG. 4 is a schematic cross-sectional view taken along the line B-B' of FIG. 1 according to another embodiment of the invention.

FIG. 3 is a schematic cross-sectional view taken along the line B-B' of FIG. 1 according to an embodiment of the invention. FIG. 4 is a schematic cross-sectional view taken along the line B-B' of FIG. 1 according to another embodiment of the invention.

With reference to FIG. 3, after forming the word line 24, a dielectric layer 26 is formed on the substrate 10. Then, a photolithographic and etching process is performed to remove a portion of the dielectric layer 26 and a portion of the charge storage layer 22, so as to form a plurality of contact holes 32a in the substrate 10 of the second portion P2. Furthermore, a plurality of contact holes 34a are formed in the substrate 10 of the first portion P1. A bottom of each of the contact holes 32a exposes the doped region 11. A bottom of each of the contact holes 34a exposes the doped region 12a of the semiconductor fin structure 40.

With reference to FIGS. 1 and 3, thereafter, first contacts 32 and second contacts 34 are formed in the contact holes 32a and the contact holes 34a respectively. The first contacts 32 are disposed on the second portion P2 of the substrate 10 and arranged in the first direction D1. Each of the first contacts 32 is electrically connected with the doped region 11 under each of the contact holes 32a. The second contacts 34 are disposed on the first portion P1 of the substrate 10. Each of the second contacts 34 is electrically connected with the corresponding doped region 12a. A method of forming the first contacts 32 and the second contacts 34 includes forming a conductor material layer on the substrate 10 first, for example. The conductor material layer is tungsten, aluminum, copper, or an alloy thereof, for example. A method of forming the conductor material layer includes physical vapor deposition, such as sputtering, for example. Thereafter, the conductor material layer outside the contact holes 32a and the contact holes 34a is removed by chemical mechanical polishing or etching back.

With reference to FIG. 4, in another embodiment, before forming the dielectric layer 26, a plurality of isolation structures 28 are formed in the second portion P2 of the substrate 10. The isolation structure 28 is a shallow trench isolation (STI) region, for example. Then, a doped region 13 is formed in the substrate 10 between the isolation structures 28. The doped region 13 is disposed above the doped region 11 and electrically connected with the doped region 11. In an embodiment, the doped regions 11, 12a, and 13 are all the first conductivity type, such as N type, for example. A dopant of the doped region 13 is phosphorus or arsenic, and a dopant dose thereof is in a range of $1\times10^{13}/cm^2$ to $1\times10^{14}/cm^2$, for example.

After that, a dielectric layer 30 is formed over the substrate 10 of the second portion P2. Next, the dielectric layer 26, the first contacts 32, and the second contacts 34 are formed. Methods of forming the dielectric layer 26, the first contacts 32, and the second contacts 34 have been specified above and thus are not repeated hereinafter. It should be noted that, in this embodiment, each of the contact holes 32a is in contact with the doped region 13 at the bottom, and the doped region 13 is disposed above the doped region 11. Thus, each of the first contacts 32 is electrically connected with the doped region 11 through the doped region 13.

Furthermore, the doped region 11 connects each of the semiconductor fin structures 40. Therefore, when the doped region 11 serves as the source, the source of each of the semiconductor fin structures 40 is electrically connected with each other. In addition, because the first contacts 32 are electrically connected with the doped region 11, the first contacts 32 are electrically connected with the source of each of the semiconductor fin structures 40.

In an embodiment, the subsequent process includes forming a wire on the first contacts 32 and the second contacts 34, such that the doped region 11 and the doped region 12a are electrically connected with an external component through the wire. Nevertheless, the invention is not limited thereto.

To sum up, according to the invention, the doped region is formed in the substrate under the body region of the semiconductor fin structure and the trench, so as to connect the doped region with each semiconductor fin structure. In addition, the doped region extends into the substrate of the second portion, so as to electrically connect the contacts with the doped region. Accordingly, the first contacts are electrically connected with each of the semiconductor fin structures. The fabricating method facilitates the connection between internal elements of the vertical memory device and not only significantly simplifies the fabricating processes of the vertical memory device but also simplifies the relative relationship between memory devices and the configuration of the stack structure thereof without sacrificing the operational performance and compatibility with the existing processes.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A fabricating method of a memory device, the fabricating method comprising:
   providing a substrate comprising a first portion and a second portion;
   forming a plurality of semiconductor fin structures on the substrate of the first portion, wherein each of the semiconductor fin structures extends in a first direction and comprises a first doped region and a body region on which the first doped region is disposed, and a trench is formed between two adjacent semiconductor fin structures;
   forming a second doped region in the substrate under the body regions of the semiconductor fin structures and the trench, wherein the second doped region extends into the substrate of the second portion;
   forming a plurality of word lines on the substrate, wherein each of the word lines extends in a second direction and covers a portion of a sidewall and a portion of a top of each of the semiconductor fin structures, and the second direction is different from the first direction;
   forming a charge storage layer between the semiconductor fin structures and the word lines;
   forming a plurality of first contacts on the second portion of the substrate, wherein the first contacts are arranged in the first direction and each of the first contacts is electrically connected with the second doped region; and
   forming a plurality of second contacts on the first portion of the substrate, wherein each of the second contacts is electrically connected with the corresponding first doped region.

2. The fabricating method according to claim 1, wherein a method of forming the semiconductor fin structures comprises:
   forming a doped layer on the substrate; and patterning the doped layer and the substrate to form the semiconductor fin structures.

3. The fabricating method according to claim 2, further comprising:
forming a hard mask layer on the doped layer and forming a patterned mask layer on the hard mask layer before patterning the doped layer and the substrate; and
patterning the hard mask layer, the doped layer, and the substrate with the patterned mask layer as a mask to form a plurality of patterned hard mask layers, the first doped regions, and the body regions.

4. The fabricating method according to claim 3, wherein the hard mask layer comprises an oxide layer and a nitride layer.

5. The fabricating method according to claim 3, wherein a material of the hard mask layer comprises silicon oxide, silicon nitride, an advanced patterning film, or a combination thereof.

6. The fabricating method according to claim 3, wherein a method of forming the second doped region comprises:
performing an ion implantation process on the substrate with the patterned hard mask layers as masks to implant a dopant in the substrate and form the second doped region.

7. The fabricating method according to claim 6, further comprising: performing a thermal annealing process to cause the dopant to form the second doped region.

8. The fabricating method according to claim 7, further comprising: removing the patterned hard mask layers.

9. The fabricating method according to claim 1, wherein the method of forming the semiconductor fin structures comprises:
forming a stack layer on the substrate, wherein the stack layer comprises a first doped layer, a body layer, and a second doped layer in sequence from bottom to top; and
patterning the first doped layer and the body layer to form the semiconductor fin structures, wherein the second doped layer serves as the second doped region.

10. The fabricating method according to claim 9, wherein the stack layer comprises the first doped layer, a first barrier layer, the body layer, a second barrier layer, and the second doped layer in sequence from bottom to top.

11. The fabricating method according to claim 10, wherein a material of the barrier layer comprises oxide, nitride, oxynitride, or a combination thereof.

12. The fabricating method according to claim 1, wherein two bottom corners of each trench are right angles, chamfer angles, or round angles.

13. The fabricating method according to claim 1, further comprising:
forming a plurality of isolation structures in the second portion of the substrate; and
forming a third doped region in the substrate between the isolation structures, wherein the third doped region is electrically connected with the second doped region,
wherein each of the first contacts is electrically connected with the second doped region through the third doped region.

14. The fabricating method according to claim 1, further comprising: forming a plurality of contact holes in the substrate of the second portion, wherein a bottom of each of the contact holes exposes the second doped region, and each of the first contacts is electrically connected with the second doped region at the bottom of the corresponding contact hole.

15. The fabricating method according to claim 1, wherein a material of the charge storage layer comprises silicon oxide, silicon nitride, or a combination thereof.

16. The fabricating method according to claim 1, wherein the second doped region connects each of the semiconductor fin structures.

17. The fabricating method according to claim 1, wherein the first doped region, the second doped region, and the third doped region are a first conductivity type; and the body region is a second conductivity type, wherein the first conductivity type and the second conductivity type are different.

* * * * *